US005972784A

United States Patent [19]

Rohatgi et al.

[11] Patent Number: 5,972,784

[45] Date of Patent: Oct. 26, 1999

[54] ARRANGEMENT, DOPANT SOURCE, AND METHOD FOR MAKING SOLAR CELLS

[75] Inventors: Ajeet Rohatgi, Marietta; Thomas W. Krygowski, Smyrna, both of Ga.

[73] Assignee: Georgia Tech Research Corporation

[21] Appl. No.: 08/839,969

[22] Filed: Apr. 24, 1997

[51] Int. Cl.[6] .............................. H01L 21/22; H01L 7/36

[52] U.S. Cl. .............................................. 438/567; 438/558

[58] Field of Search .............................. 438/57, 558, 554, 438/565, 567

[56] References Cited

U.S. PATENT DOCUMENTS

| | | |
|---|---|---|
| 3,841,927 | 10/1974 | Florence et al. . |
| 3,920,882 | 11/1975 | Venkatu . |
| 3,923,563 | 12/1975 | Venkatu . |
| 3,928,096 | 12/1975 | Vergano et al. . |
| 3,997,351 | 12/1976 | Vergano et al. . |
| 4,588,455 | 5/1986 | Gesner . |
| 4,661,177 | 4/1987 | Powell . |
| 4,857,480 | 8/1989 | Plante . |
| 5,208,185 | 5/1993 | Mori et al. . |

OTHER PUBLICATIONS

ASM Handbook, vol. 5, Surface Engineering, 1994.

Dr. Ajeet Rohatgi, Annual Review for Jul. 1995–Aug. 1996: Sandia National Laboratories Subcontract No. AA–1638, oct. 25, 1996, Relevant pages enclosed (See attached statement).

Paul A. Basore, James M. Gee, M. Elaine Buck, W. Kent Schubert, and Douglas S. Ruby; Simplified high–efficiency silicon cell processing; *Solar Energy Materials and Solar Cells*; vol. 34; pp. 91–100; 1994.

A.U. Ebong, C.B. Honsberg, and S.R. Wenham; Fabrication of double sided buried contact (DSBC) silicon solar cell by simultaneous pre–deposition and diffusion of boron and phosphorus; *Solar Energy Materials and Solar Cells*; vol. 44; pp. 271–278, Nov. 30, 1996.

*Primary Examiner*—Charles Bowers
*Assistant Examiner*—Martin Sulsky
*Attorney, Agent, or Firm*—Thomas, Kayden, Horstemeyer & Risley, L.L.P.

[57] ABSTRACT

Disclosed is an arrangement, dopant source and method used in the fabrication of photocells that minimize handling of cell wafers and involve a single furnace step. First, dopant sources are created by depositing selected dopants onto both surfaces of source wafers. The concentration of dopant that is placed on the surface is relatively low so that the sources are starved sources. These sources are stacked with photocell wafers in alternating orientation in a furnace. Next, the temperature is raised and thermal diffusion takes place whereby the dopant leaves the source wafers and becomes diffused in a cell wafer creating the junctions necessary for photocells to operate. The concentration of dopant diffused into a single side of the cell wafer is proportional to the concentration placed on the respective dopant source facing the side of the cell wafer. Then, in the same thermal cycle, a layer of oxide is created by introducing oxygen into the furnace environment after sufficient diffusion has taken place. Finally, the cell wafers receive an anti-reflective coating and electrical contacts for the purpose of gathering electrical charge.

27 Claims, 13 Drawing Sheets

40
45
47

45
50

45
55

ARRANGEMENT, DOPANT SOURCE, AND METHOD FOR MAKING SOLAR CELLS

FIELD OF THE INVENTION

The present disclosure generally relates to the manufacturing of semiconductors, and more particularly, to a method, arrangement and dopant source used in the manufacturing of solar cells.

BACKGROUND OF THE INVENTION

This disclosure is another chapter in the never ending quest to find more desirable sources of energy. At the present time, the demand for energy is satisfied primarily by the consumption of fossil fuels and nuclear energy. The consumption of energy is accompanied by the creation of pollutants that are beginning to pose a serious threat to the environment. Forests are threatened by acid rain. The heat generated by the consumption of such energy sources has caused global warming, the long term effects of which are as yet unknown. For these and many more reasons, the search is on for efficient and inexpensive sources of energy without pollution.

One such source that meets this goal is the generation of electricity from sunlight. The primary component used in this process are solar cells or, more specifically, photo-voltaic devices. Photo-voltaic devices essentially create electrical current when exposed to sunlight. However, the photo-voltaic technology is not without its problems as well. Chief of these is the high cost of manufacturing photo-voltaic cells. A second problem is that such devices tend to be inefficient, the electronic energy created being only a fraction of the sunlight energy received. Consequently, less expensive methods to make more efficient photo-voltaic devices are desirable.

As shown in FIG. 1A, photo-voltaic cell is made of a silicon wafer 5 that has been doped with a base dopant material. The sides of the wafer 5 are then diffused with dopant material forming two diffused regions 10. In a sense, the wafer will have internal layers of diffused material and non-diffused material. The wafer is then covered with a layer of oxide 15 on both sides which enhances the photo-voltaic effect by passivating the surfaces. The final steps include the addition of a non-reflective coating 25 to ensure the absorption of sunlight and the introduction of contacts layers 30 and 35 which are connected to the diffused layers 10 which are used to connect the solar cell to an electrical load.

There are various conventional methods used in creating these photocells that yield certain photo-cell efficiencies. Among the processes that yield the greatest efficiencies is that which is described next.

The first step in this process is to clean the silicon wafers from which the solar cells are produced. This cleaning process is quite extensive as will be discussed. Next, a layer of masking oxide is grown on both sides of the silicon wafers. This step is performed in a furnace at a predetermined temperature. Oxygen is introduced into the heated furnace and over time a layer of oxide grows on the sides of the cell wafers. This is a common procedure that is within the understanding of those skilled in the art.

After the masking layer is grown, it is removed from the rear side of the wafer. This is done by an etching process known to those skilled in the art in which the oxide layer is removed. After the layer of oxide on the rear side has been removed, the cell wafer is cleaned in an involved process known to those skilled in the art using powerful chemicals to remove contaminants from the surfaces of the wafer. This procedure can be quite time consuming adding significant cost to the procedure.

After the layer of oxide is removed from the rear side, the next operation is also the second furnace cycle in which the wafers are placed into a furnace with the etched rear side exposed to receive the diffusion of dopant. The oxide coating remaining on the front side prevents the dopant from diffusing into the front side of the cell wafer. The furnace is then heated to a predetermined temperature and the dopant is introduced into the environment. At elevated temperatures, the dopant will diffuse into the exposed rear side of the wafer. The depth of the diffusion into the wafer is known as the "junction depth" and is a function of the temperature and time of the heating cycle. All of the above operations require absolute cleanliness to prevent contaminants from being diffused into the cell wafer along with the dopant.

While the rear side is diffused with dopant in the second thermal step above, a thick glass-like layer is formed over both sides of the wafer. This layer is a byproduct created by excess dopant in the glass. In this step, the wafer is cooled down and the glass layer is removed in another etching process to prevent further diffused during subsequent thermal cycles. The layer of oxide on the opposite side of the wafer is etched off as well. As before, this etching step provides an opportunity for impurities to be introduced into the overall process and also incurs additional time and expense due to materials handling and consumption of cleaning chemicals. Also lost is any potential for surface passivation when etching the oxide as known to those skilled in the art.

The next operation is to clean the wafers after the etching. As before, this cleaning is quite extensive requiring several chemicals including acids. Consequently, the cleaning step poses a threat to the environment due to the necessary disposal of these cleaning chemicals. Also, the cleaning process is quite time consuming incurring additional time and expense in the overall process.

The next step involves the third furnace cycle in which a layer of masking oxide is once again grown on both sides of the cell wafer. This step is much like the first step with the additional time and expense incurred. After the oxide layer is grown, this time the oxide is removed from the front side by etching and the oxide on the back acts as a diffusion mask. As before, the wafer will undergo an extensive cleaning process after the etching is complete.

The operation that follows is the fourth furnace cycle in which the front side of the cell wafer is diffused with dopant. Once again, the wafers are placed in a furnace with the front side exposed and the temperature is raised to the predetermined level. The dopant is then introduced into the environment and is diffused into the front side of the wafer. As with the dopant diffused into the rear side, the junction depth of the front side is a function of the time and temperature of the heating cycle. Also, as was the case with the rear side diffused, a thick glass-like substance is formed on both sides of the wafer as a byproduct of the diffusion process.

Not surprisingly, the next operation will involve the etching of this second glass-like layer and the oxide covering the front and rear sides of the cell wafer since the diffusion glass contains a high concentration of excess dopant. As with all previous etching cycles, contaminants will have an opportunity to be introduced into the process. Also, additional time and expense are incurred.

This is followed by another extensive chemical cleaning cycle. The time and expense necessary to clean the wafer is incurred once again. Also, contaminants are given another opportunity to enter the process.

The next step involves the thermal oxidation of the solar cell wafers. In this step the doped wafers are once again placed in a furnace and heated to a predetermined temperature. Oxygen is then injected into the furnace which reacts with the silicon to form silicon dioxide, $SiO_2$, on both surfaces of the cell wafer. The layer of oxide that results enhances the photo-voltaic process by reducing the loss of sunlight generated carriers or electron-hole pairs into the silicon surface. Also, during the oxidation process, any contaminants that have found their way into the process may be diffused into the cell wafers.

After the thermal oxidation has taken place, ohmic contacts are placed on the solar cell. The surface on which sunlight is to be absorbed is fitted with a grid of contacts which are in direct contact with the front diffused layer of the cell wafer. This grid ensures uniform collection of electrical charge while allowing sunlight to shine into the cell itself. The reverse side is fitted with a solid conductor over the back oxide which makes contact with the back diffusion through "points" patterned in the oxide. For lower efficiency cell designs, the back oxide could be removed completely and metal may be deposited on the entire back surface.

The final operation involves the creation of an anti-reflection coating on the front surface through which sunlight is gathered. This coating ensures maximum energy output by preventing sunlight from being reflected rather than absorbed by the solar cell.

While the above process can create relatively efficient photocells, it is not without difficulties. First is the problem of preventing contaminants from entering the process, especially during the five furnace cycles. Contaminants present in the cell wafer can significantly degrade the performance of photocells. They may find their way onto the cell wafer at any time during the process. Once the cell wafer is placed in a furnace, any contaminants that are present either on the cell wafer or in the furnace can be diffused into the cell wafer at greater temperatures. Also, contaminants that are already inside the wafer move around and may decorate other defects such as dislocations as known to those skilled in the art. In order to prevent the degradation in photo cell performance due to contaminants, all of the process steps are performed in a very clean environment such as a clean room. This type of environment is extremely expensive to maintain thereby making it impractical to mass produce high efficiency cells at a relatively low cost with this process.

Another problem that accompanies this method of photocell manufacture is the creation of structural defects due to the multiple furnace cycles. When the cell wafers are heated, a certain amount of stress relief will occur. The relief of stresses in the cell material may cause dislocations and other defects in the wafer material that effect their efficiency. Consequently, it is desirable to have as few furnace cycles as is possible.

The foregoing process is not the only method by which solar cells are created. There are other methods which are less time consuming yielding lesser efficiencies that are known to those skilled in the art.

Consequently, the foregoing illustrates a need for a low cost method of manufacturing high efficiency solar cells featuring as few steps as possible to minimize handling and opportunities for contaminants to be introduced into the process. In particular, such a method should require as few furnace cycles as possible to prevent contamination and degradation of the cell wafers.

SUMMARY OF THE INVENTION

The present invention provides for a process of creating photocells that minimizes handling of cell wafers and involves a single furnace step. First, dopant sources are created by depositing selected dopants onto the surfaces of silicon wafers or other appropriate material. In the preferred embodiment, the dopant is in a commercially available liquid form. The dopant concentration of the liquid placed on the surface is relatively low so that the sources are properly labeled as "starved" or "limited" sources. Generally there are two different types of sources created using two different types of dopant, however, the same dopant may be placed on the sources depending on the application. These sources are stacked with solar cell wafers in a predetermined orientation in a furnace. Next, the temperature is raised and thermal diffusion takes place whereby the dopant leaves the source wafer and is transported to the cell wafers creating simultaneously both of the junctions necessary for high-efficiency photocells to operate. Then, in the same thermal cycle, a layer of oxide is grown on both sides of the wafers by introducing oxygen into the furnace environment. Finally, the cell wafers receive an anti-reflective coating and electrical contacts for the purpose of transferring electrical energy to an external load.

The instant disclosure provides several distinct advantages over the prior art. First is the creation of photocells with a single furnace cycle. This advantage will provide less opportunity for contaminants to enter the cell wafer and will cause less degradation due to stress relief as compared to multiple thermal cycles. Also, contaminants are given less opportunity to decorate defects as they tend to do at elevated temperatures which results in photocells with greater efficiency. Additionally, less thermal energy is necessary which results in less wear and tear on the furnace itself as well as reduced energy costs.

The reduced handling provides distinct advantages over the prior art as well. Specifically, the significant reduction in manufacturing steps results in significantly reduced man hours required for the production of photocells. Also, less wear and tear on machinery used during the process results which translates into higher utilization of capital equipment.

Additionally, the extensive cleanings required by the prior art are not necessary. The volatile chemicals used in these cleaning cycles are not needed. This means the cost associated with the purchase, storing, handling, use and disposal of these chemicals is eliminated. Also, the threat to handlers and the environment associated with the use and disposal of these chemicals is eliminated as well.

Other features and advantages of the present invention will become apparent to one with skill in the art upon examination of the following drawings and detailed description. It is intended that all such additional features and advantages be included herein within the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. In the drawings, like reference numerals designate corresponding parts throughout the several views.

DETAILED DESCRIPTION OF THE PREFERRED EMBODIMENT

Figure 1A:
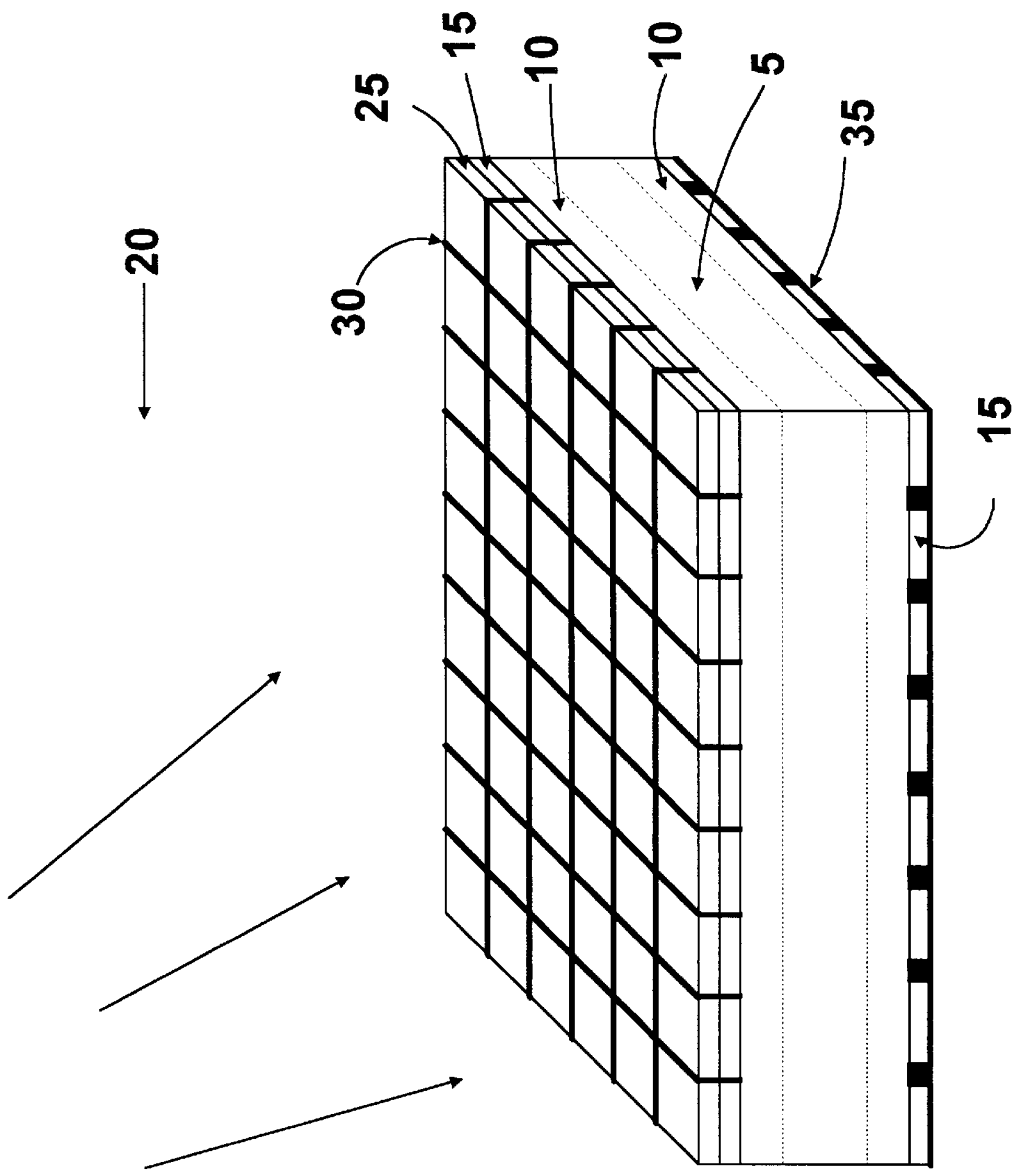
FIG. 1A is a drawing illustrating the structure of a general photocell.

This disclosure pertains to the creation of photo-voltaic cells. FIG. 1A shows an end view of a finished photo-voltaic cell. Generally, such cells begin as a wafer of silicon 5 or a "cell wafer" of approximately 0.3 millimeters thick. Through thermal diffusion, both sides of the cell wafer 5 are doped with a dopant material 10 chosen for its particular properties. The completed cell wafer 5 thus has three internal layers labeled n+, p and p+. The existence of such layers in photo-voltaic cells are well within the understanding of one skilled in the art.

Next, the cell wafer 5 is given a thin layer of oxide 15 on both sides to enhance the photo-voltaic process. Typically, the oxide layers are grown in a furnace at a set temperature. After the oxide layer, contacts 30 and 35 are attached to the cell to output the electric power. On the sunlight side, there is disposed a grid contact 30 that will allow the passage of sunlight. The bottom contact 35 is a solid plate with point contacts disposed through the oxide layer. Finally, on the side where sunlight 20 is to enter the photocell, a non-reflective coating 25 is applied to prevent sunlight from being reflected away from the photocell. This discussion of the physical construction is well known to those skilled in the art and will not be discussed in detail. There are several methods to create these photocells.

Figure 1B:
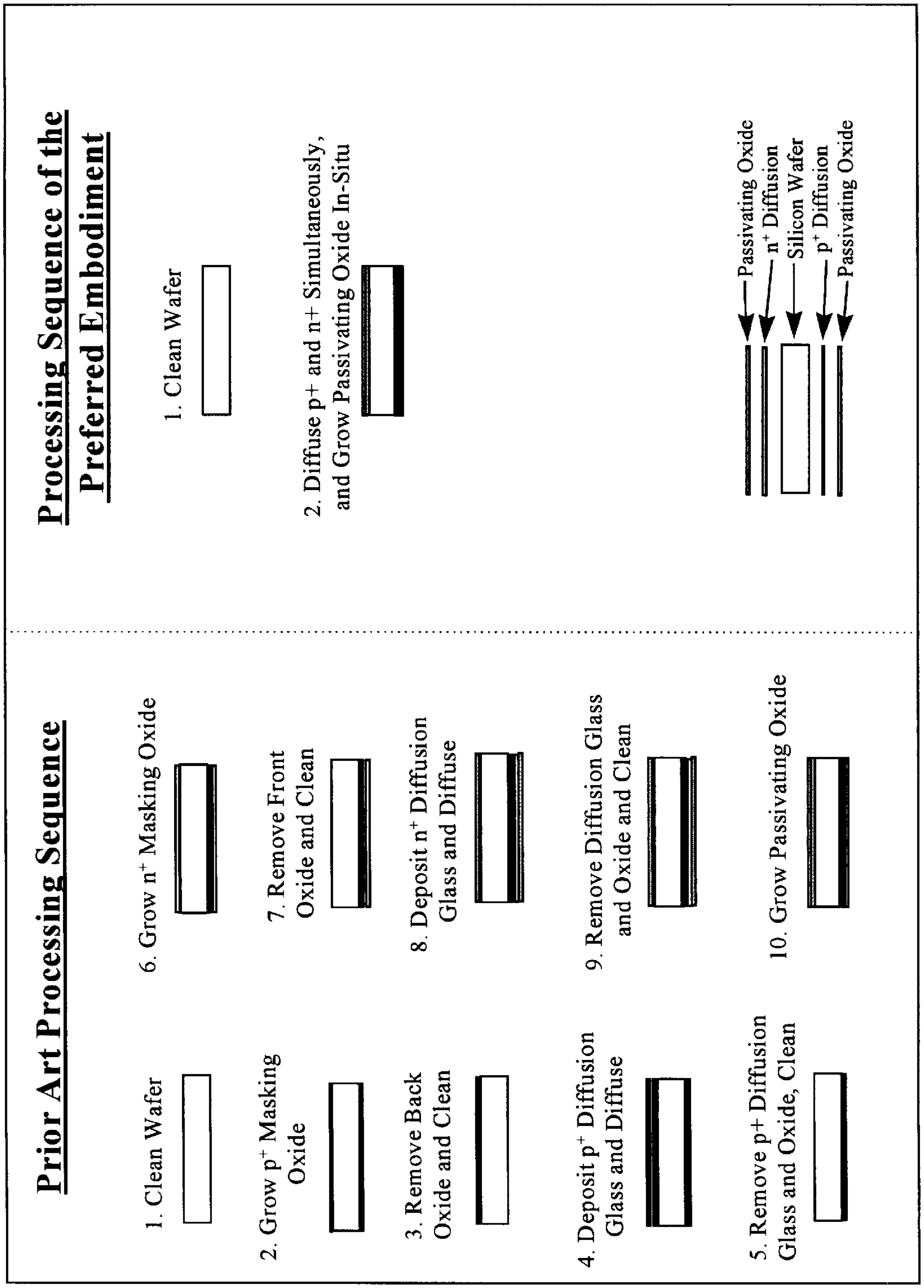
FIG. 1B is a drawing graphically depicting the differences between the preferred embodiment according to the invention and prior art method of manufacturing solar cells.

By means of an overview, FIG. 1B shows an exemplary view graphically comparing the process steps of a prior art method of manufacture of solar cells as depicted in FIG. 1A and the process steps of the preferred embodiment.

Creation of Dopant Sources

To create photo-voltaic cells as shown in FIG. 1A according to the preferred embodiment, the first step is to create dopant sources. To accomplish this, an amount of a first dopant is deposited on both sides of a first source wafer. In similar fashion, an amount of a second dopant is placed on both sides of a second source wafer. In the preferred embodiment shown here, the source wafers are made of silicon. However, many other materials may be suitable for this purpose such as germanium, quartz, or any suitable substrate that can withstand high temperatures of approximately 1000° C. Also, the first and second dopants can be any of a number of materials including phosphorous, boron, aluminum, gallium, arsenic, indium, antimony, or any other suitable dopant material known to those skilled in the art. Different dopants used in the creation of photo-voltaic cells are chosen for their particular properties. It is even possible to choose the same dopant material as both a first and second dopant. The selection of dopants is a process well known to one skilled in the art and will not be discussed in detail.

Figures 2A, 2B, 2C:
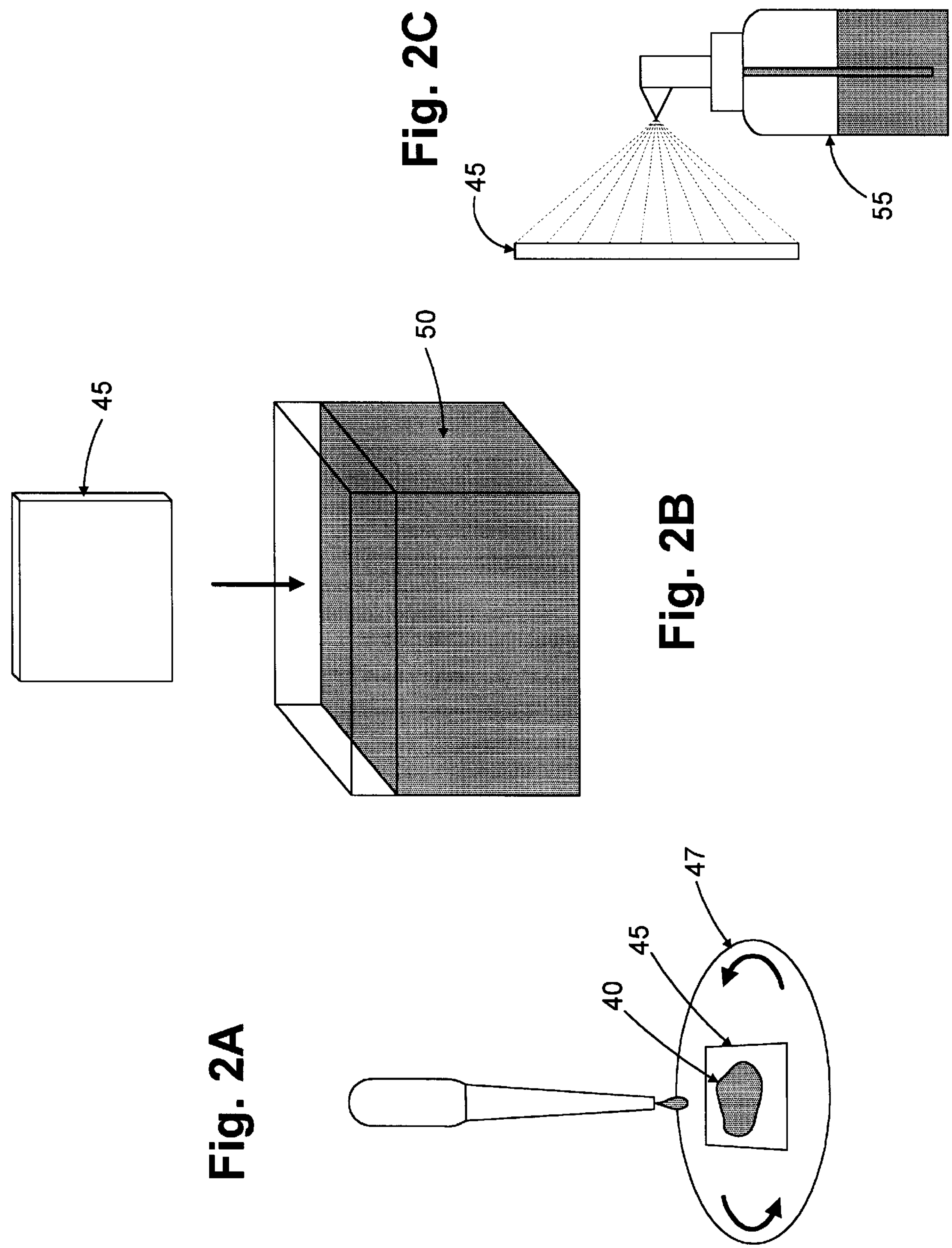
FIG. 2A is drawing illustrating the spin on method used to create starved dopant sources used in the process of manufacturing the photocell of FIG. 1A.
FIG. 2B is drawing illustrating the dip method used to create starved dopant sources used in the process of manufacturing the photocell of FIG. 1A.
FIG. 2C is drawing illustrating the spray on method used to create starved dopant sources used in the process of manufacturing the photocell of FIG. 1A.

There are several methods by which one may place a dopant onto a source wafer. FIGS. 2A through 2C illustrate the various methods. The preferred method as shown in FIG. 2A is spinning in which an amount of solution containing the dopant 40 is placed onto the source wafer 45. Next, the wafer is placed on a spinner and the wafer is spun around at high revolutions per minute (RPM's). The spinning action serves to distribute the dopant uniformly across the surface of the wafer 45. The wafers 45 are then baked at relatively low temperatures causing any chemical components to leave the surface of the wafer 45 through thermal excitation. This baking is not absolutely necessary as the wafers can simply be placed out to dry. What remains behind is a deposition of the compound containing the desired dopant 40.

Two other methods by which dopant is placed on the source wafers are dipping as shown in FIG. 2B, or spraying as shown in FIG. 2C. In the former, the source wafers 45 are placed in a bath of liquid dopant solution 50. In the later, liquid dopant is sprayed onto the source wafers 45 using a spraying device 55. In either case, the source wafers 45 are then dried as previously described.

Figure 3:
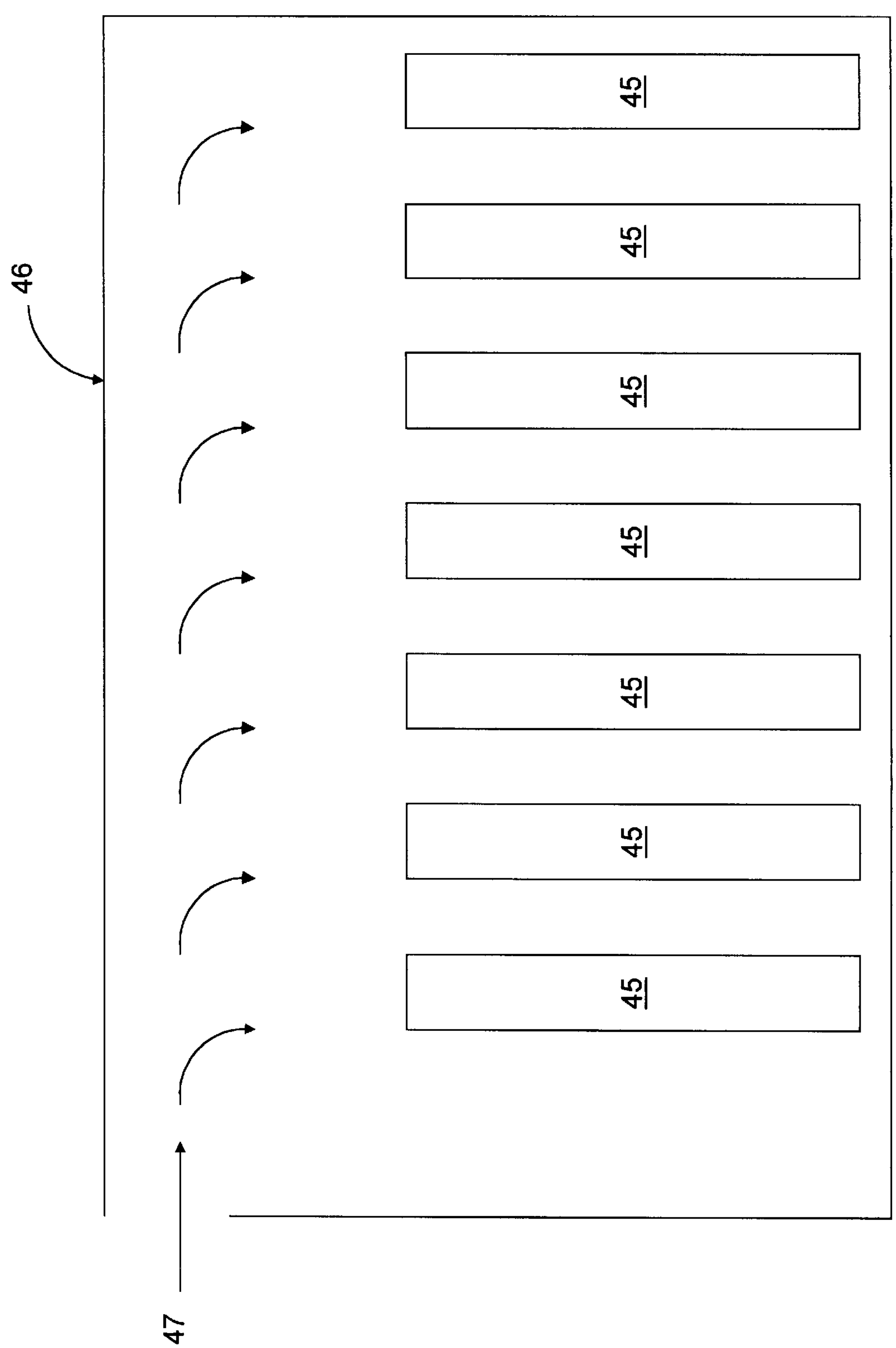
FIG. 3 is a drawing illustrating the method of creating starved dopant sources by thermal diffusion.

In another method as shown in FIG. 3, the source wafer acquires the dopant in a diffusion furnace. According to this method, silicon source wafers 45 are placed in a furnace 46 at temperatures of around 800° C. to 920° C. An individual wafer or several can be arranged in the furnace 46. The dopant 47 is then introduced into the furnace environment where it deposits a doped glass layer into the exposed sides of the source wafers 45. The dopant in this glass is used to dope the solar cell wafers in a subsequent diffusion. The temperature is then reduced and the now doped source wafers 45 are removed from the furnace 46.

Regardless of the process used to create them, the source wafers 45 as described herein have the additional feature that they can be used multiple times. After they have been used to create photocells, they are made ready for the next use by cleaning through a quick dip in an acid solution. Obviously, this feature will save considerable expense in that the number of wafers required to make sources is reduced accordingly.

Stacking the Wafers

Figure 4:
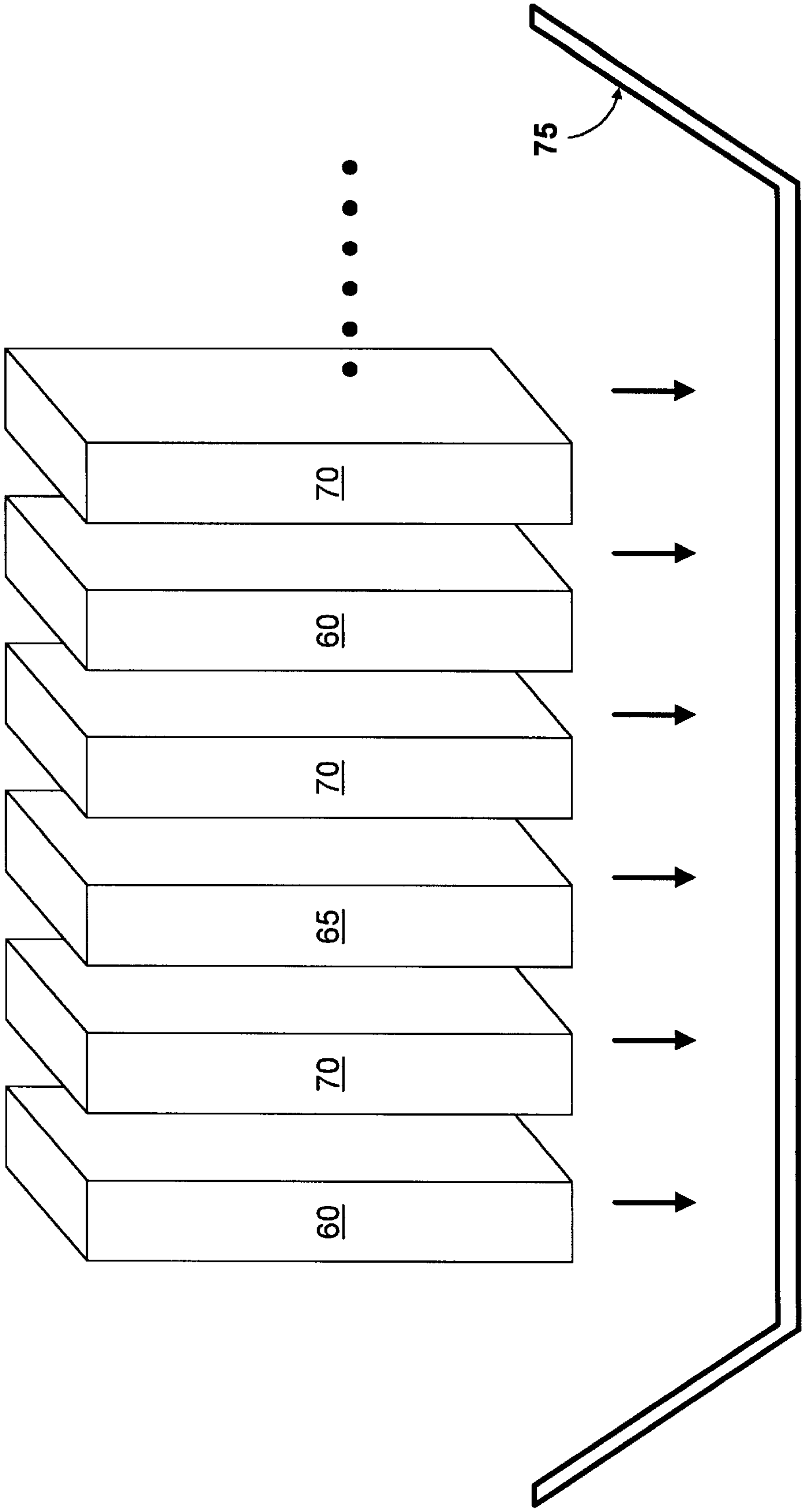
FIG. 4 is drawing illustrating a stacking arrangement of cell wafers and starved dopant sources of FIGS. 2 and 3.

Turning to FIG. 4, once the first dopant sources 60 and the second dopant sources 65 have been created, the next step in the preferred embodiment is to "stack" them in alternating orientation with the cell wafers 70 to be placed in a furnace.

The term "stack" in the present embodiment is defined as the placement of the cell and source wafers next to each other in parallel. An "alternating orientation" is defined by placing a cell wafer 70 between and parallel to a first dopant source 60 and a second dopant source 65. FIG. 4 shows the preferred embodiment where multiple photocells are created by stacking the source and cell wafers in a sequence of "first dopant source 60, cell wafer 70, second dopant source 65, cell wafer 70, first dopant source 60, cell wafer 70, second dopant source 65, cell wafer," . . . and so on. Also in the preferred embodiment, the wafers are stacked on a boat 75 to be placed in a furnace to facilitate mass production. The actual spacing between the wafers is an important parameter as will soon be explained.

Thermal Diffusion

Figure 5:
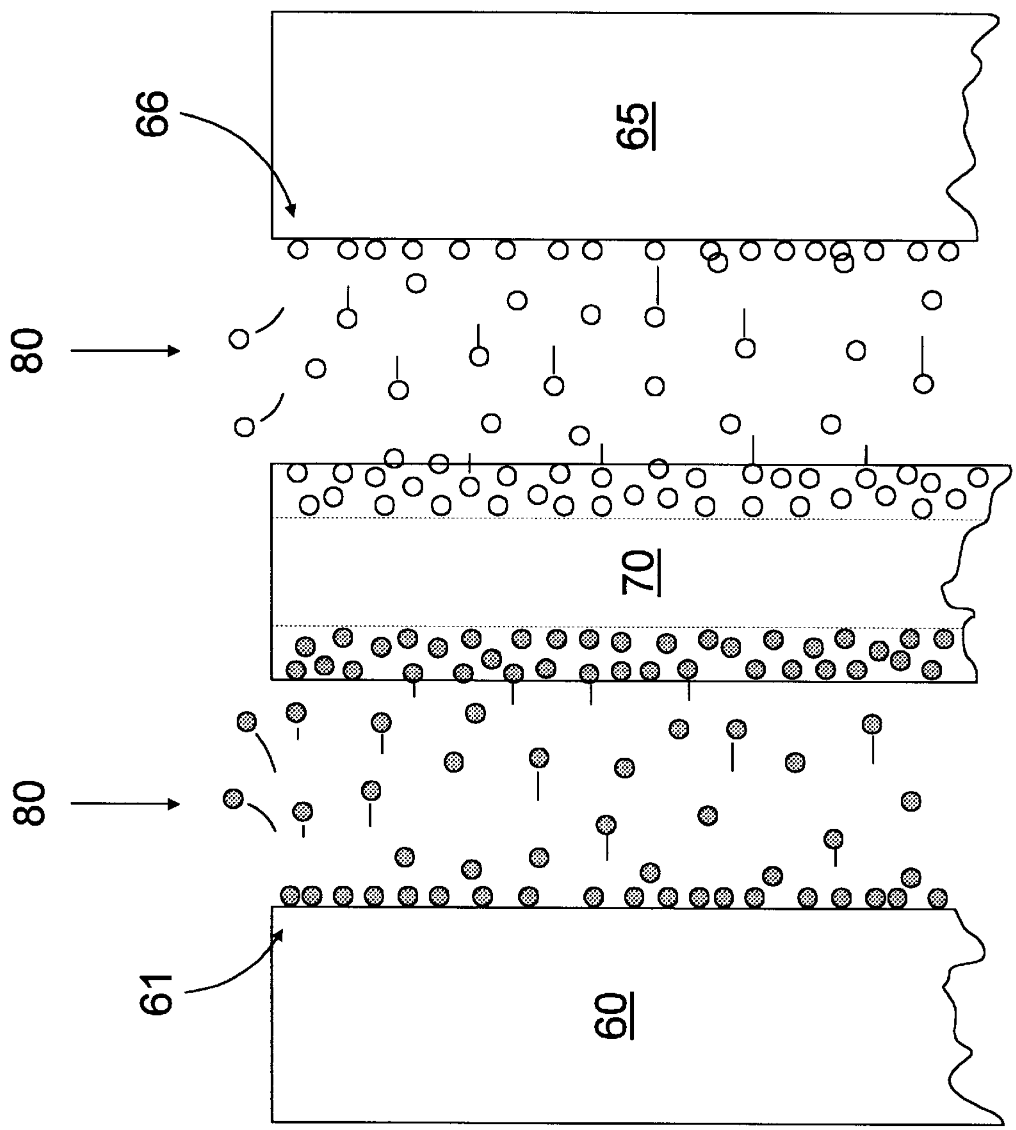
FIG. 5 is a drawing illustrating the thermal diffusion of a cell wafer by dopant supplied by starved dopant sources in the stacking arrangement of FIG. 4.

Turning to FIG. 5, once the wafers are properly stacked, they are placed in a furnace where the temperature is ramped up to approximately 1000° C. The furnace is filled with "carrier gas" which is chosen so as not to react or interfere with the diffusion process. Common gasses used for this function include nitrogen, argon or other gasses. The choice of carrier gas is a common expedient well within the understanding of those skilled in the art.

It is during this heating cycle that the diffusion of the first and second dopants into the two sides of the cell wafers 70 takes place. The thermal excitation will cause first dopant molecules 61 and second dopant molecules 66 to leave the dopant sources, navigate the gaps 80 between the cell wafer 70 and the first or second source wafers 60 and 65, and become diffused into the sides of the cell wafer 70 as shown in FIG. 5. The depth of the penetration of both first and second dopants 61 and 66 into the cell wafer 70 is termed the "junction depth". The junction depth is controlled by the temperature of the furnace and the time that the thermal cycle lasts. The determination of the junction depth by control of the furnace temperature as such is well understood by those skilled in the art. Another important parameter is the surface concentration, which refers to the concentration of dopant diffused into the cell wafer. Together the surface concentration and junction depth are termed the "profile" of a particular solar cell.

Also note that the gaps 80 between the wafers may affect the diffusion process and must be optimized. For example, gaps 80 that are too close may allow contaminants to migrate to the cell wafers 70 with the first and second dopants 61 and 66. Thus an optimum gap 80 must be used for the best results, such gaps 80 being determined through interpolation depending on the dopants 61 and 66 used and other parameters.

Figure 6:
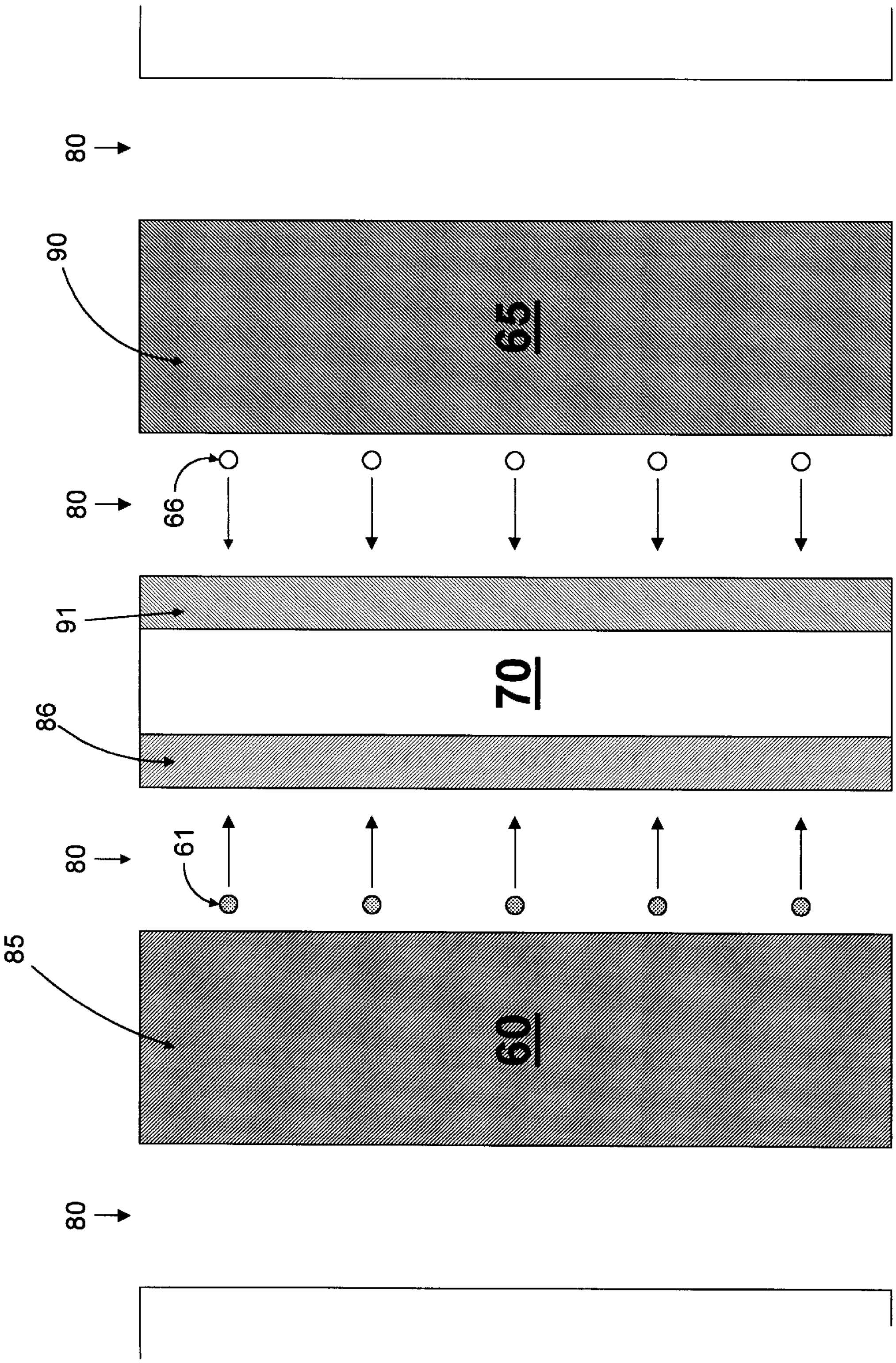
FIG. 6 is a drawing illustrating relative dopant concentrations of the dopant deposited on the starved source wafers and the dopant diffused in the cell wafer of FIG. 5.

Turning to FIG. 6, it has been discovered that the surface concentration of the dopant diffused into a particular side of a cell wafer 70 is directly proportional to the concentration of the dopants 61 and 66 disposed on the source wafers 60 and 65 facing that particular cell. Thus in the preferred embodiment, the first concentration 85 of first dopant molecules 61 deposited on first dopant source 60 will result in the first diffused concentration 86 of first dopant molecules 61 into the cell wafer 70. Also, a second concentration 90 of second dopant molecules 66 deposited on second dopant source 65 will result in a second diffused concentration 91 of second dopant molecules 66 into the cell wafer 70. The first diffused concentration 86 is proportional to the first concentration 85. Likewise, the second diffused concentration 91 is proportional to the second concentration 90. This is due in part to the fact that the concentration of a dopant on a particular source wafer will determine how many dopant molecules are available to migrate across the gap 80 during the diffusion process. Thus, the first and second diffused concentrations 86 and 91 of dopant can be selected by depositing a predetermined concentration of first and second dopants 61 and 66 on to first and second dopant sources 60 and 65.

Thus the present invention offers a third degree of freedom to control the doping profile in the solar cell wafer during the simultaneous diffusion of the cell wafer with two different dopant sources. The doping profiles on the two sides of the cell wafer may be varied over a wide range by controlling the dopant source concentration even though time and temperature are the same. Thus, the doping profiles necessary for high efficiency cells can be achieved on both sides of the cell wafer.

Figure 7:
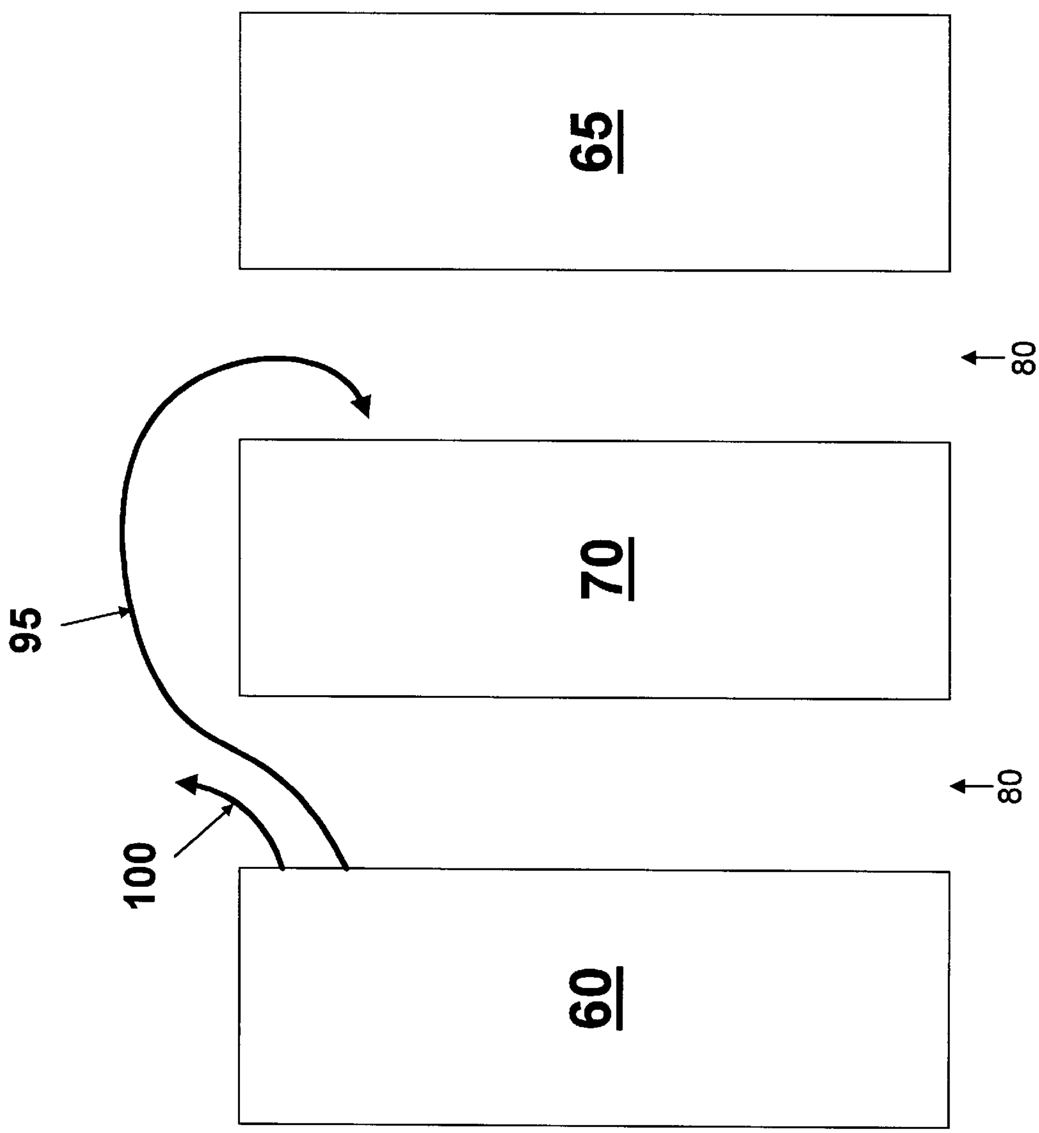
FIG. 7 is a drawing illustrating the cross-doping and unwanted release of dopant into the ambient that may occur in the stacking arrangement of FIG. 4.

Turning to FIG. 7, while the concentrations of first and second dopants on both the first and second dopant sources 60 and 65 may vary according to the desired concentration of the diffusion of the cell wafer 70, due to the problems of cross-doping 95 and unwanted release 100 of dopant into the furnace, the concentration of first and second dopants on either dopant source 60 or 65 may not exceed a maximum concentration threshold. Cross-doping 95 refers to the diffusion of dopant into the wrong side of the cell wafer 70 by dopant molecules that travel around the cell wafer rather than simply traversing the gap 80. Specifically, in the preferred embodiment, the stacking of the wafers provides this particular pathway due to the fact that both sides of the cell wafer 70 are being doped at the same time. It should be noted that although the cross-doping 95 is depicted as migration from first dopant source 60 to the opposite side of cell wafer 70. It is understood that the same migration can occur from second dopant source 65 to the opposite side of the cell wafer 70.

The unwanted release 100 of dopant molecules into the furnace refers to the contamination of the furnace itself. Dopant molecules that exit the stack of wafers may become embedded in the furnace walls or in the boat. Later, when the furnace is reheated, these molecules may become free and contaminate the diffusion of other photocells using the same furnace, boat or other equipment present in the furnace.

The present embodiment avoids the problem of cross-doping 95 and release 100 by the use of "starved sources". Starved sources are simply dopant source wafers in which the concentration of dopant does not exceed the forestated maximum concentration threshold. The precise value of this threshold is predetermined based on the amount of cross-doping 95 and release 100 that can be tolerated in the specific application. The amount of cross-doping 95 and release 100 are related to the particular vapor pressure of the dopant or the segregation coefficient of the dopant between the source wafer and gas ambient which in turn is a function of the temperature of the furnace. For example, and not to be construed as a limitation, a generally accepted threshold for many applications is one in which cross-doping 95 will be less than 10% of the dopant concentration on a given side of a cell wafer.

To explain further, at a given temperature, the ambient environment in the furnace (hereinafter the "ambient") will allow the release of a specific amount of dopant in a gas form. Once that amount has been released, the ambient is considered saturated. In the case of a very concentrated or infinite source of dopant, the ambient will become saturated with that dopant due to the fact that such a source can supply the amount of dopant necessary to achieve saturation.

If the concentration of dopant on the source wafer is of a lesser amount, or in other words, if the source is starved, then there will be no saturation of the ambient as there will not be a sufficient supply of dopant to saturate the furnace environment. In such a case, the amount of dopant released in the ambient and the amount held by the source will reach a state of equilibrium where the maximum amount of dopant released in the ambient will be less than the saturation amount. Taking this a step further, if the concentration of dopant on the dopant sources is low enough, the amount of dopant that is released into the ambient may be insignificant. As the concentration of dopant on the starved source increases, the amount of dopant released in the ambient will increase.

Thus, the maximum concentration threshold is related to the predetermined maximum level of unwanted release 100 and maximum level of cross doping 95 that may be tolerated in a specific application based on the foregoing principles. Generally, due to their lower concentrations, starved sources are "used up" after a single diffusion cycle requiring more dopant to be placed on the source for further use.

In addition, another factor that bears on the diffusion process is the sponge like quality of the cell wafers. When placed in the elevated temperatures of the furnace, the dopant will be naturally attracted to the wafer which is just across the gap 80 which does not contain any dopant. Thus in the preferred embodiment, this attraction will further aid in guiding the dopant from the first and second dopant sources 60 and 65 across the gap 80 toward the cell wafer 70.

Figure 8:
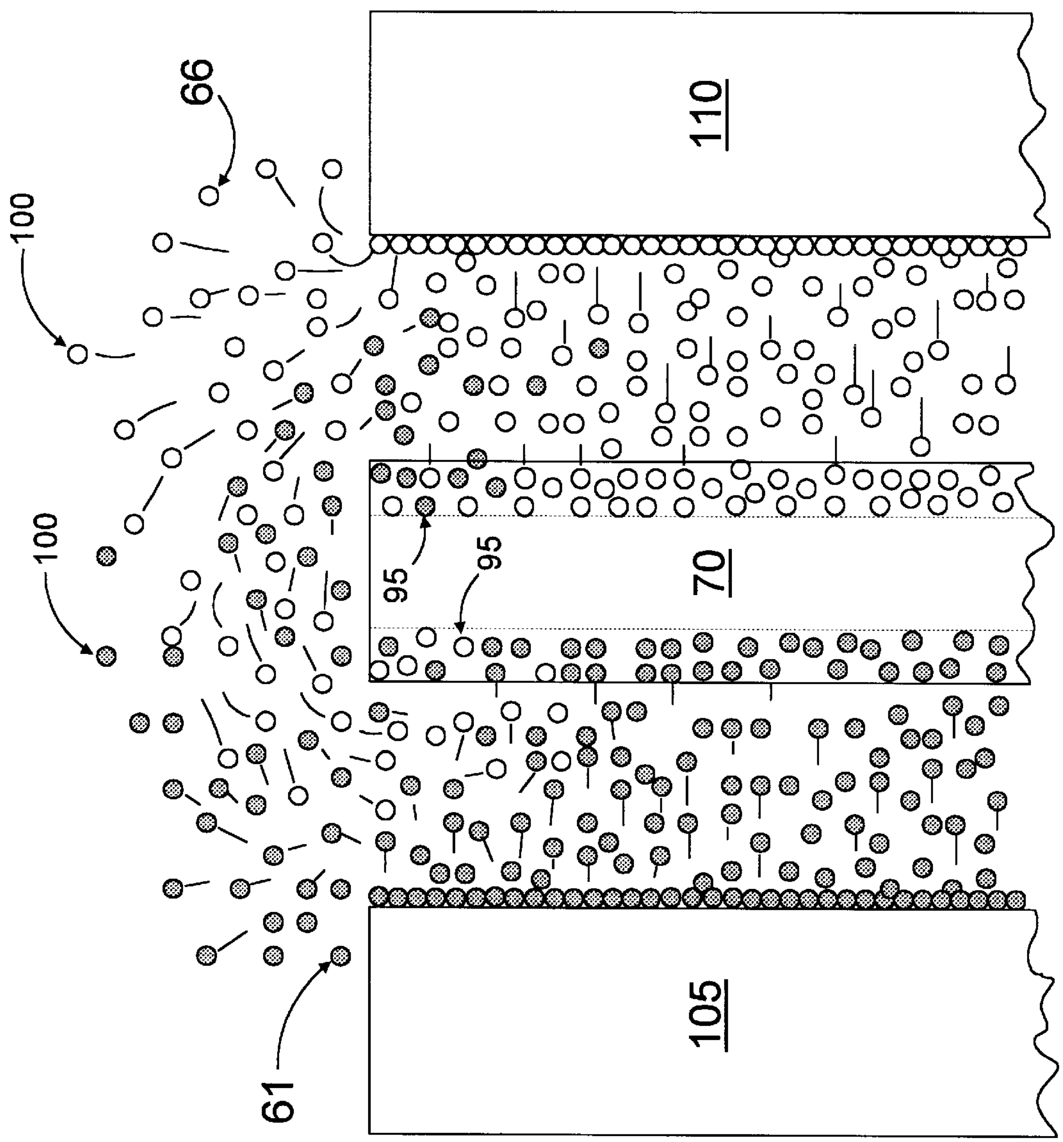
FIG. 8 is a drawing illustrating thermal diffusion with infinite dopant sources which graphically depicts the cross-doping and unwanted release of dopant into the ambient of FIG. 7.

To illustrate the foregoing, FIG. 8 shows an infinite first dopant source 105 and infinite second dopant source 110, both of which can release enough dopant to reach the saturation point of the ambient. As a consequence, a far greater amount of first and second dopant molecules 61 and 66 are released from first and second sources 105 and 110 in an attempt to gain equilibrium at the particular vapor pressure of the first and second dopants 61 and 66 in the furnace. In other words, the dopant molecules 61 and 66 are released as the ambient absorbs the saturation amount of each of these dopants. The result is that many more dopant molecules will fill the gaps 80 than can be diffused into the cell wafer 70 at a given time. As shown in FIG. 8, the result is that a large number of dopant molecules 61 and 66 are released into the ambient 100 and significant cross-doping 95 occurs.

Also, in the case of infinite sources as shown in FIG. 8, as a byproduct of the significant amount of dopants present, a glass-like layer is formed on the surface of the cell wafers. This glass-like layer results from the formation of a thick oxide layer which is heavily doped with the first and second dopants. Before the cell wafer can proceed to later steps in the manufacturing process, this layer should be removed. The creation and removal of this glass-like layer due to the use of infinite dopant sources is well known to those skilled in the art and will not be discussed in detail.

Turning once again to FIG. 5, what is shown is a graphic depiction of the preferred embodiment of the diffusion process using starved first and second dopant sources 60 and 65 with the cell wafer 70 disposed in between. The concentration of dopant on first and second dopant sources 60 and 65 as illustrated is below a predetermined maximum concentration threshold where a minimum amount of dopant is released in the ambient and any cross-doping that occurs is negligible. In this case, the amount of dopant in the ambient is below the saturation level. The spacing of the cell wafers 70 and first and second dopant sources 60 and 65 in close proximity will take advantage of the sponge-like characteristic of the cell wafer 70 in that dopant molecules will naturally be attracted across the gap 80 to the cell wafer rather than out into the ambient.

Another benefit of the use of starved sources is that the glass-like layer that occurs with the use of infinite sources is not created with the starved sources. The amount of glass that will actually occur is negligible. Consequently, there is no need to remove such a layer in the preferred embodiment.

FIGS. 5 and 8 show that one skilled in the art would determine the desired concentration of the first and second dopant sources 60 and 65 based on an iterative process. The greater the concentration, the more cross-doping and unwanted release of dopant in the ambient will occur and the glass-like layer will form on the surface of the cell wafer. Where sources are starved, then these problems are avoided. However, the concentration should not be too low such that there is not enough dopant to achieve the desired profile on the cell wafers 70. Thus, the actual concentration of dopant given to a particular source wafer is a choice well within the understanding of one skilled in the art based upon the foregoing principles.

Filtering of Contaminants

Figure 9:
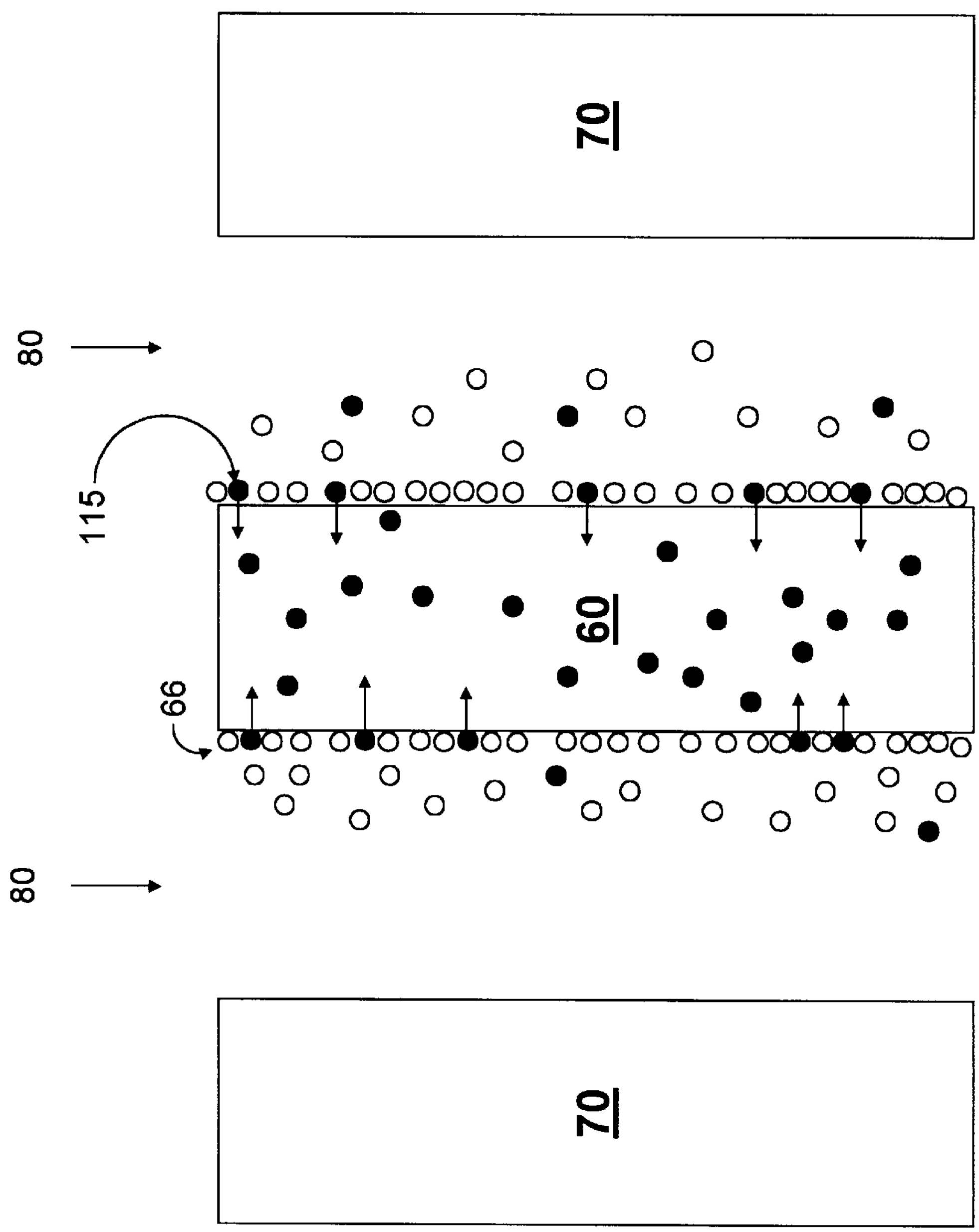
FIG. 9 is a drawing that illustrates the filtering action of starved source wafers which absorb contaminants during the diffusion process of FIG. 5.

Turning to FIG. 9, in the preferred embodiment, the starved sources provide an added filtering function that reduces the amount of contaminants that enter the cell wafer, thereby resulting in greater photocell efficiency. Although great attempts may be taken to ensure that contaminants do not enter the process of manufacturing photocells, some invariably do. FIG. 9 shows first dopant source 60 on which is deposited first dopant molecules 66 and contaminants 115. The contaminants 115 are interspersed with the first dopant molecules 66. The first dopant molecules 66 will leave the source 60 during the diffusion process as discussed previously. The diffusion process will also result in some liberated contaminants 115 that traverse the gap 80 to the cell wafer 70. However, the first dopant source 60 will absorb a far greater number of contaminants 115 than are liberated. In addition, the liberated concentration is very small due to the low vapor pressure of most harmful contaminants and also due to the segregation coefficient of contaminants between the source wafer 60 and the ambient. Thus, the first dopant source 60 will act as a filter by absorbing most contaminants 115 and preventing them from being diffused into cell wafers 70 across the gaps 80. It is understood that this filtering action is not limited to the first dopant sources 60, but will occur with second dopant sources not shown in FIG. 9. The source wafers 60 have a significant capacity for the contaminants 115, allowing the multiple use of the same source wafers 60.

In-Situ Oxidation

Figure 10:
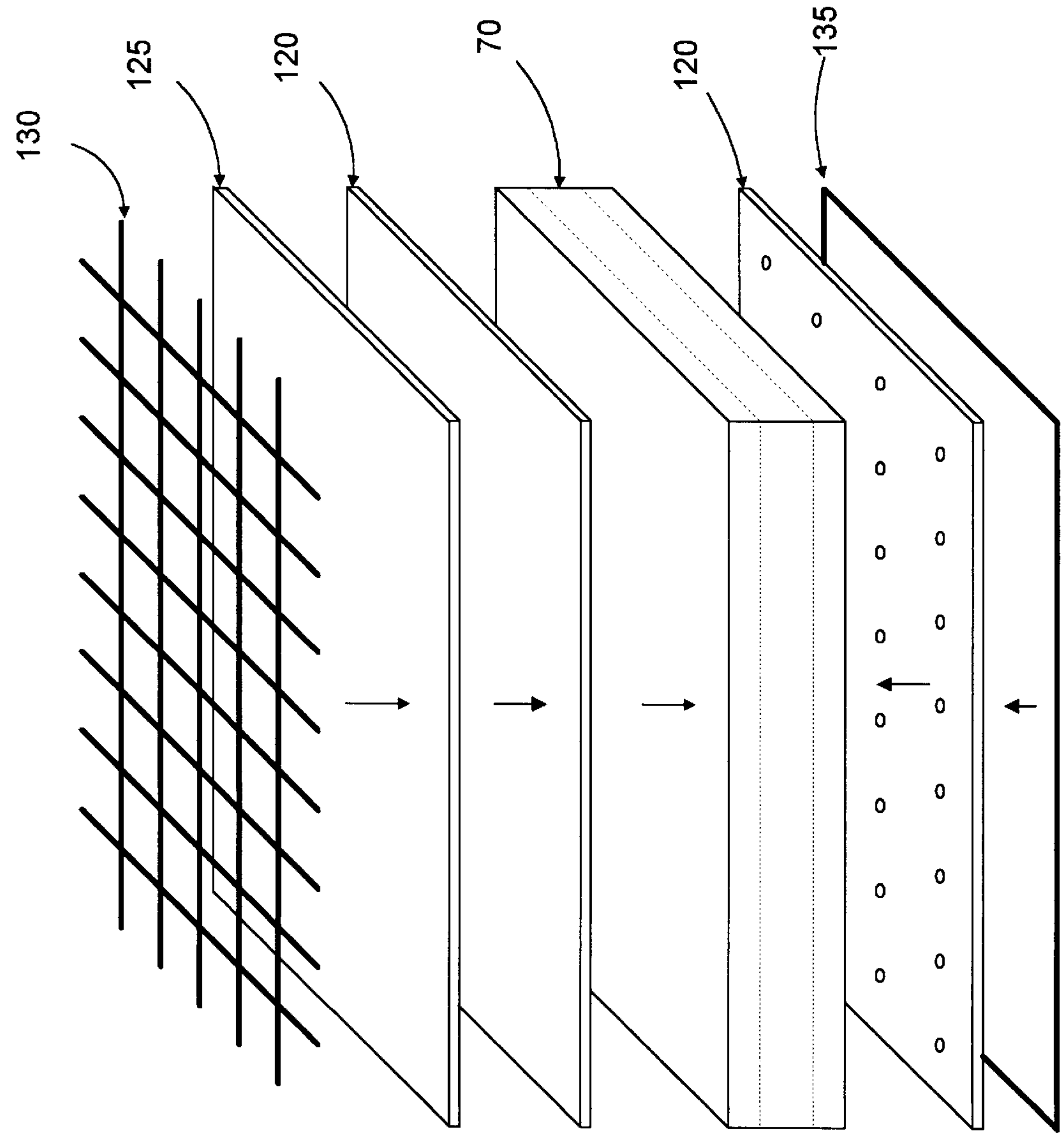
FIG. 10 is a drawing illustrating the individual separated components of the photocell of FIG. 1A.

Turning now to FIG. 10, after a sufficient time has elapsed in the heating cycle such that the desired junction depth is achieved, a silicon dioxide layer 120 is placed on both sides of the doped cell wafers 70 to enhance the collection of electrical charge. Normally, the oxide layer 120 is created by placing the cell wafers 70 in a furnace and injecting oxygen into the ambient. The layer essentially grows as oxygen molecules attach to the silicon atoms on the surfaces of the cell wafers 70. The thickness of the oxide layer 120 is a function of the time and temperature in which the cell wafers 70 are exposed to the oxygen enriched ambient. This process of growing an oxide layer is a common procedure understood by those skilled in the art.

In the preferred embodiment, after the time of the diffusion process has passed so that the desired junction depth has been achieved, the oxide layer 120 is grown by injecting oxygen into the furnace during the same thermal cycle. This can be done because there is virtually no glass-like layer (generally less than or equal to 70 angstroms) to remove from the surfaces of the cell wafers 70 as a byproduct of the diffusion process. This step saves vital time and expense as a separate thermal cycle is not necessary to grow the oxide layer 120. Also, the cleaning operation necessary before the thermal cycle is eliminated. Oxidation that is performed in the same thermal cycle as in the preferred embodiment is labeled "in-situ" oxidation, referring to the fact that the cell wafers 70 need not be removed from the furnace after the desired junction depth is achieved.

After the layer of oxide is grown, a non-reflective coating 125 is placed on top of the layer of the oxide that will face sunlight. This coating will ensure that sunlight is absorbed by the photocell rather than reflected away. There are some cases in which the in-situ oxide layer 120 can serve as an non-reflective coating, although it may not be quite as effective as an added coating as there may be a slight decrease in cell performance. In such cases, the decrease in cell efficiency may be justified by the reduction in fabrication costs etc.

Finally, contacts 130 and 135 are fitted on the near completed photo-cell wafer. The side of the wafer through which sunlight is received is fitted with a grid-like contact 130 which is mated with the doped silicon layer through the oxide layer 120 and the non-reflective coating 125. The shape of this contact allows sunlight to pass through while collecting electrical charge all along the surface of the cell. The opposite side of the cell wafer is fitted with a solid plate-like contact 135 with points protruding through the oxide layer coming into contact with the diffused silicon. This is because there is no need for sunlight to shine through. In some cases, the oxide layer 120 may be removed and the solid plate contact 135 is mated directly with the diffused silicon. The attachment of the contacts 130 and 135 as described here is well within the understanding of those skilled in the art.

Figure 11:
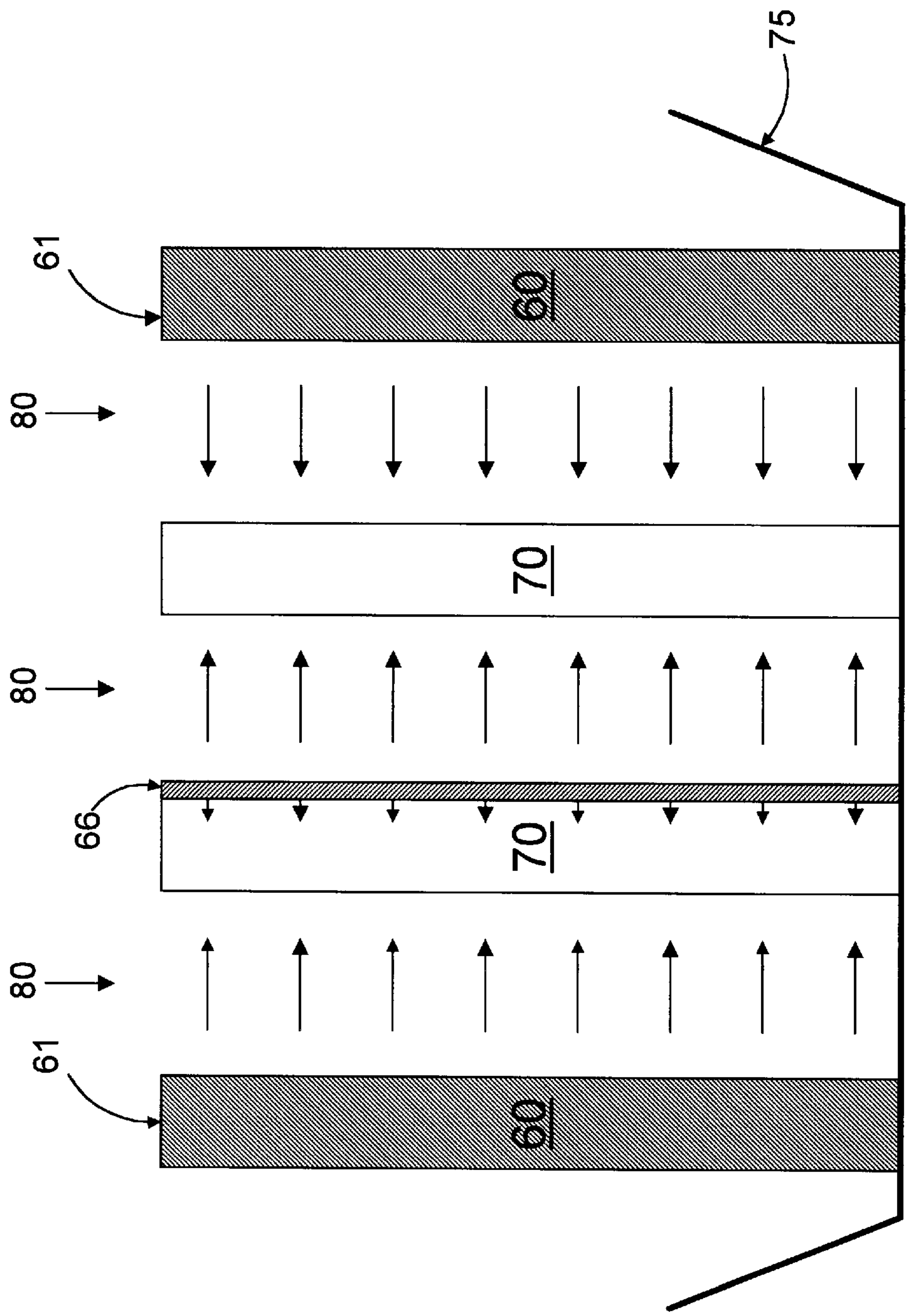
FIG. 11 is a drawing illustrating the stacking arrangement of the second embodiment of the invention.

Turning to FIG. 11, shown is a second embodiment of the present invention. Shown is a quasi-alternating stacking orientation which is defined by the placement of two cell wafers 70 side by side between two first dopant sources 60 on which is disposed a first dopant 61. An amount of second dopant 66 is disposed on the side of one of the cell wafers 70 facing away from the dopant sources 60. The second dopant may be placed onto the cell wafer 70 in liquid form by the previous methods described including spinning or spraying or other appropriate method. Once the cell wafers 70 and the sources 60 are stacked, they are placed in the furnace as previously described and the diffusion process takes place. In particular, the dopant 66 is diffused into the side of the wafer 70 on which it is disposed as well as traversing the gap 80 to be diffused in the side of the second wafer 70. The cell wafers then undergo in-situ oxidation as before.

The second embodiment of the invention has the advantage of doing away with the second dopant source wafers which translates into greater output of solar cells per each furnace cycle and cost savings. However, one disadvantage is that the cell wafer 70 on which the dopant 66 is disposed will form a glass-like layer thereby degrading the efficiency of the solar cell that results from that particular wafer. Additionally, any impurities that exist in the dopant 66 will be diffused into the cell wafer 70 on which the dopant 66 is disposed.

Figure 12:
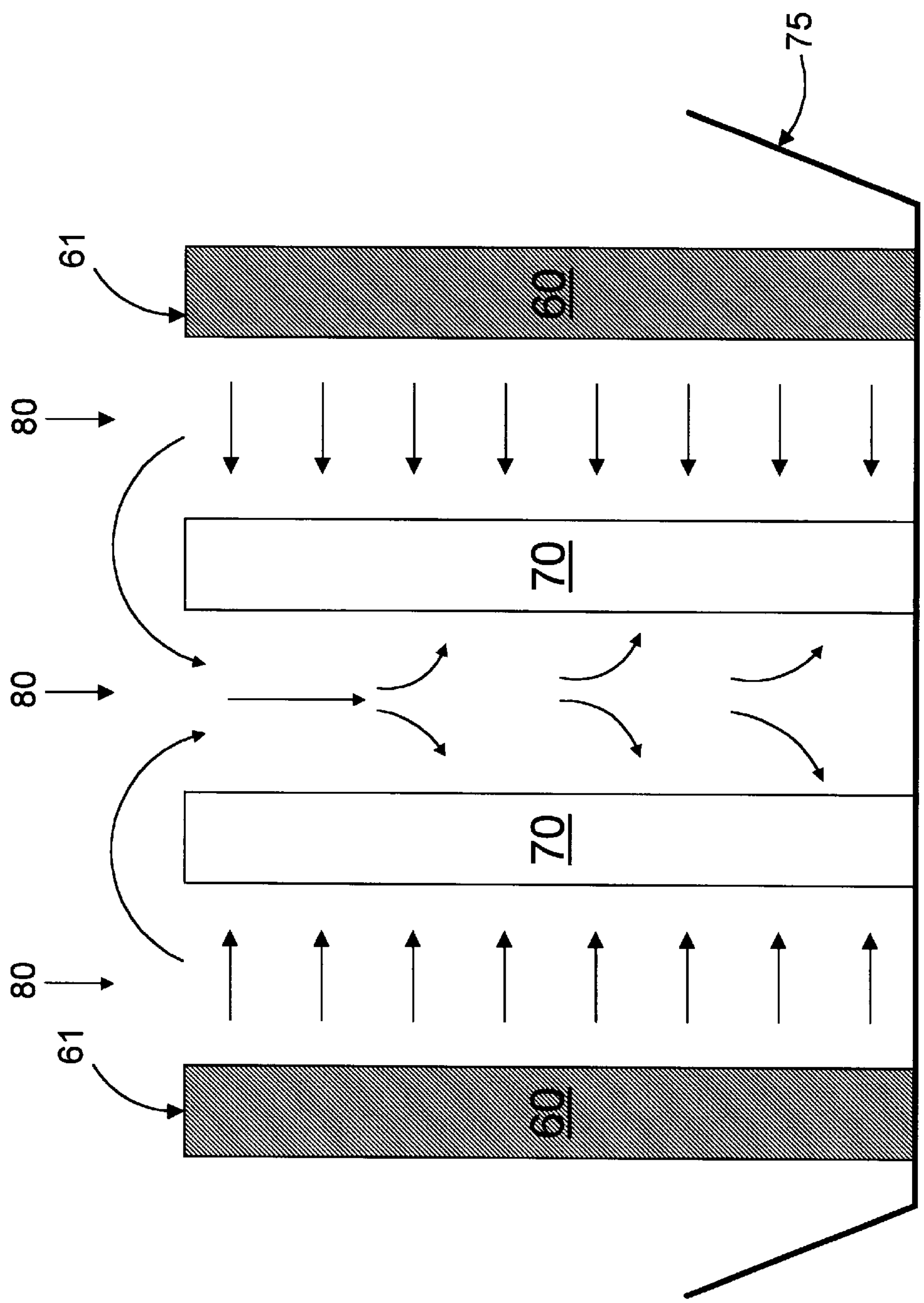
FIG. 12 is a drawing illustrating the stacking arrangement of the second embodiment of the invention.

A third embodiment of the invention is shown in FIG. 12. The third embodiment involves a different stacking orientation in which, for example and not to be read as a limitation, floating junction solar cells may be produced. Generally, a floating junction solar cell is one in which both sides are diffused with the same dopant at the same or differing concentration levels. The stacking orientation referred to in FIG. 12 is defined as stacking two cell wafers 70 between to dopant sources 60. The dopant sources 60 both contain the same dopant 61. This stacking arrangement is then placed in a furnace as described in the preferred embodiment of the invention. In the furnace, the dopant 61 will exit the dopant sources 60 and traverse the gap 80 and become diffused in the side of the cell wafers 70. Depending on the concentration of dopant 61 disposed on the dopant sources 60, some dopant 61 will be released into the ambient and make its way around to the reverse sides of the cell wafers 70 as shown and become diffused into the cell wafers 70. Thus both sides of the cell wafers will be diffused with the dopant 61, but the concentration of the sides of the cell wafers 70 facing the dopant sources 60 will be much greater. The concentration on the reverse sides of the cell wafers 70 will receive a lesser diffusion of the dopant 61. The exact concentration received by both sides is predetermined based upon the concentration of dopant 61 disposed on the dopant sources 60. Generally, the correlation between the concentration of dopant 61 disposed on the dopant sources 60 and the diffusion concentrations of dopant 61 achieved in the cell wafers 70 is determined based on an iterative process.

Many variations and modifications may be made to the preferred embodiment of the invention without departing substantially from the spirit and principles of the invention. All such modifications and variations are intended to be included herein within the scope of the present invention, as defined by the following claims.

Now, therefore, the following is claimed:

1. A method for manufacturing photo-voltaic cells, comprising the steps of:

stacking at least one first starved dopant source wafer having a first dopant and at least one second starved dopant source wafer having a second dopant in an alternating orientation with at least one cell wafer, the first dopant being different from the second dopant; and thermally diffusing the first and second dopants into the cell wafer by heating the stacked first and second starved dopant source wafers and the cell wafer in a furnace for a period of time.

2. The method of claim 1, further comprising the step of depositing a layer of oxide onto a first side and a second side of the cell wafer in the furnace after the period of time.

3. The method of claim 2, further comprising the steps of:

depositing a non-reflective layer onto a sunlight side of the cell wafer; and attaching at least one contact onto at least one side of the cell wafer.

4. The method of claim 2, wherein the step of depositing a layer of oxide onto a first side and a second side of the cell wafer in the furnace after the period of time is performed in-situ after the step of thermally diffusing the first and second dopants into the cell wafer.

5. The method of claim 1, further comprising the step of creating the first starved dopant source wafer having a first dopant and the second starved dopant source wafer having a second dopant.

6. The method of claim 5, wherein the step of creating the first and second starved dopant source wafers further comprises the steps of:

placing an amount of a first liquid dopant onto the first starved dopant source wafer and an amount of a second liquid dopant onto the second starved dopant source wafer;

spinning the first and second starved dopant source wafers in a spinning apparatus to uniformly spread the first and second liquid dopants across the respective first and second starved dopant source wafers; and drying the first and second starved dopant source wafers to cause at least one unwanted liquid dopant component evaporate.

7. The method of claim 5, wherein the step of creating the first and second starved dopant source wafers further comprises the steps of:

dipping the first starved dopant source wafer in a bath of a first liquid dopant;

dipping the second starved dopant source wafer in a bath of a second liquid dopant; and drying the first and second starved dopant source wafers to cause at least one unwanted liquid dopant component to evaporate.

8. The method of claim 5, wherein the step of creating the first and second starved dopant source wafers further comprises the steps of:

spraying an amount of a first liquid dopant onto the first starved dopant source wafer;

spraying an amount of a second liquid dopant onto the second starved dopant source wafer; and drying the first and second starved dopant source wafers to cause at least one unwanted liquid dopant component to evaporate.

9. The method of claim 5, wherein the step of creating the first and second starved dopant source wafers further comprises the steps of:

heating the first starved dopant source wafer in a furnace for a period of time;

introducing the first dopant into the furnace, wherein the first dopant is diffused into the first starved dopant source wafer;

heating the second starved dopant source wafer in a furnace for a period of time; and introducing the second dopant into the furnace, wherein the second dopant is diffused into the second starved dopant source wafer.

10. The method of claim 1, wherein the step of thermally diffusing the first and second dopants into the cell wafer further comprises the step of filtering of at least one contaminant by absorbing the contaminant into the first and second starved dopant source wafers.

11. The method of claim 1, wherein the step of thermally diffusing the first and second dopants into the cell wafer further comprises the step of determining the concentration of the first and second dopants diffused into the respective sides of the cell wafer by selecting the concentrations of the first and second dopants disposed on the first and second starved dopant sources.

12. The method of claim 1, wherein the step of thermally diffusing the first and second dopants into the cell wafer further comprises the step of releasing an amount of each of the first and second dopant from the first and second starved dopants sources, respectively, into the environment of the furnace, the amounts each of the first and second dopants released being less than a respective saturation amount for the first and second dopants.

13. The method of claim 12, further comprising the step of substantially reducing an amount of cross-doping in the cell wafer.

14. A method for manufacturing photo-voltaic cells, comprising the steps of:

creating a plurality of starved dopant source wafers having a dopant;

depositing a concentration of the dopant on a side of a first cell wafer;

stacking the starved dopant source wafers, the first cell wafer and a second cell wafer in quasi-alternating orientation in a furnace; and thermally diffusing the dopant into the cell wafers by heating the stacked starved dopant source wafers and the first and second cell wafers in a furnace for a period of time.

15. A method for diffusing dopant into cell wafers using thermal diffusion in a furnace, comprising the steps of:

creating a plurality of starved dopant source wafers having an amount of a dopant, the amount of the dopant being less than a saturation amount of the furnace;

stacking the starved dopant source wafers, and at least two cell wafers in a floating junction stacking orientation; and thermally diffusing the dopant into both sides of the cell wafers by heating the stacked starved dopant source wafers and the cell wafers in the furnace for a period of time, thereby reducing a cross-doping of the cell wafer.

16. A method for manufacturing photo-voltaic cells via thermal diffused in a furnace, comprising the steps of:

stacking at least one starved dopant source wafer with at least one cell wafer, the starved dopant source wafer having an amount of at least one dopant that is less than a saturation amount of the furnace, thereby substantially reducing a cross-doping of the cell wafer; and thermally diffusing the dopant into the cell wafer by heating the stacked starved dopant source wafer and the cell wafer in the furnace for a period of time.

17. The method of claim 16, further comprising the step of depositing a layer of oxide onto the cell wafer in the furnace in-situ after the period of time.

18. The method of claim 16, wherein the step of thermally diffusing the dopant into the cell wafer further comprises the step of filtering of at least one contaminant by absorbing the contaminant into the starved dopant source wafer.

19. The method of claim 16, wherein the step of thermally diffusing the dopant into the cell wafer further comprises the step of thermally diffusing the dopant into the cell wafer while substantially reducing an unwanted release of the dopant into the furnace environment.

20. The method of claim 16, wherein the step of thermally diffusing the dopant into the cell wafer further comprises the step of controlling a concentration of the dopant diffused into the cell wafer by controlling an amount of dopant disposed on the starved dopant source wafer.

21. The method of claim 16, wherein the step of stacking the at least one starved dopant source wafer with at least one cell wafer further comprises the step of stacking in an alternating orientation, a first starved dopant source wafer having a first concentration of the dopant, a cell wafer, and a second starved dopant source wafer having a second concentration of the dopant, wherein the first concentration of the dopant is different from the second concentration of the dopant.

22. The method of claim 16, wherein the step of stacking the at least one starved dopant source wafer with at least one cell wafer further comprises the step of stacking in an alternating orientation, a first starved dopant source wafer having an amount of a first dopant, a cell wafer, and a second starved dopant source wafer having an amount of a second dopant, wherein the first dopant is different from the second dopant.

23. The method of claim 16, further comprising the step of creating the starved dopant source wafer.

24. The method of claim 16, wherein the step of creating the starved dopant source wafer further comprises the steps of:

placing an amount of a liquid dopant onto the starved dopant source wafer;

spinning the starved dopant source wafer in a spinning apparatus to uniformly spread the liquid dopant across the starved dopant source wafer; and drying the starved dopant source wafer to cause at least one unwanted liquid dopant components to evaporate.

25. The method of claim 16, wherein the step of creating the starved dopant source wafer further comprises the steps of:

dipping the starved dopant source wafer in a bath of a liquid dopant; and drying the starved dopant source wafer to cause at least one unwanted liquid dopant component to evaporate.

26. The method of claim 16, wherein the step of creating the starved dopant source wafer further comprises the steps of:

spraying an amount of a liquid dopant onto the starved dopant source wafer; and drying the starved dopant source wafer to cause at least one unwanted liquid dopant component to evaporate.

27. The method of claim 16, wherein the step of creating the starved dopant source wafer further comprises the steps of:

heating the starved dopant source wafer in a furnace for a period of time; and introducing the dopant into the furnace, wherein the dopant is diffused into the starved dopant source wafer.

* * * * *

United States Patent And Trademark Office

CERTIFICATE OF CORRECTION

PATENT NO. : 5,972,784
DATED : October 26, 1999
INVENTOR(S): Rohatgi et al.

It is certified that error appears in the above-identified patent and that said Letters Patent is hereby corrected as shown below.

Column 1, after the Title of the Invention and before the "Field of Invention", insert the following:

--STATEMENT REGARDING FEDERALLY SPONSORED RESEARCH OR DEVELOPMENT

The U.S. government has a paid-up license in this invention and the right in limited circumstances to require the patent owner to license others on reasonable terms as provided for by the terms of Contract Number DE-AC04-94AL85000 awarded by the Department of Energy of the United States.--

Signed and Sealed this

Seventeenth Day of April, 2001

*Attest:*

Nicholas P. Godici

NICHOLAS P. GODICI

*Attesting Officer*

*Acting Director of the United States Patent and Trademark Office*